(12) United States Patent
Sohn

(10) Patent No.: US 7,512,027 B2
(45) Date of Patent: Mar. 31, 2009

(54) REFRESH CONTROL CIRCUIT IN SEMICONDUCTOR MEMORY APPARATUS AND METHOD OF CONTROLLING PERIOD OF REFRESH SIGNAL USING THE SAME

(75) Inventor: Young-Chul Sohn, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 133 days.

(21) Appl. No.: 11/646,470

(22) Filed: Dec. 28, 2006

(65) Prior Publication Data
US 2007/0274145 A1 Nov. 29, 2007

(30) Foreign Application Priority Data
May 9, 2006 (KR) .............. 10-2006-0041622

(51) Int. Cl.
G11C 7/00 (2006.01)
(52) U.S. Cl. ............... 365/222; 365/189.07; 365/225.7
(58) Field of Classification Search ........... 365/222, 365/189.07, 225.7
See application file for complete search history.

(56) References Cited

U.S. PATENT DOCUMENTS

| | | | |
|---|---|---|---|
| 5,680,359 A | 10/1997 | Jeong | |
| 5,862,093 A | 1/1999 | Sakakibara | |
| 6,597,614 B2 | 7/2003 | Nam et al. | |
| 2005/0185491 A1* | 8/2005 | Kim et al. | 365/222 |
| 2006/0023545 A1 | 2/2006 | Ito et al. | |
| 2006/0023546 A1 | 2/2006 | Park | |
| 2006/0087901 A1 | 4/2006 | Hong et al. | |
| 2006/0221745 A1 | 10/2006 | Lee | |

FOREIGN PATENT DOCUMENTS

| | | |
|---|---|---|
| JP | 7-73668 | 3/1995 |
| JP | 2003-5861 A | 1/2003 |
| JP | 2005-222574 | 8/2005 |
| KR | 1020050067520 | 7/2005 |
| KR | 1020050082579 | 8/2005 |
| KR | 1020050100261 | 10/2005 |
| KR | 1020050114938 | 12/2005 |
| KR | 1020060010952 | 2/2006 |

* cited by examiner

Primary Examiner—Huan Hoang
(74) Attorney, Agent, or Firm—Venable LLP; Jeffri A. Kaminski

(57) ABSTRACT

A refresh control circuit includes a temperature detecting unit that detects the temperature and generates a temperature detecting voltage, a control unit that generates a plurality of control signals, a digital converting unit that converts the temperature detecting voltage into a plurality of bits of digital code and outputs a plurality of bits of digital code according to the control of a plurality of control signals, and a refresh signal generating unit that generates a refresh signal with a period corresponding to the input of a plurality of bits of digital code.

35 Claims, 5 Drawing Sheets

REFRESH CONTROL CIRCUIT IN SEMICONDUCTOR MEMORY APPARATUS AND METHOD OF CONTROLLING PERIOD OF REFRESH SIGNAL USING THE SAME

BACKGROUND OF THE INVENTION

1. Technical Field

The present invention relates to a refresh control circuit in a semiconductor memory apparatus and a method of controlling a period of a refresh signal using the same, and more particularly, to a refresh control circuit in a semiconductor memory apparatus and a method of controlling a period of a refresh signal using the same that controls the period of a refresh signal according to temperature.

2. Related Art

In general, a memory cell of a DRAM (Dynamic Random Access Memory) may include one transistor and one capacitor, and the data stored in the capacitor is volatile. Therefore, in order to prevent data being lost due to generation of a leakage current from semiconductor memory cells, a refresh operation is required such that data is periodically rewritten in each of the cells so as to maintain the data that each of the cells stores. The refresh operation is performed when a refresh signal is enabled. The refresh signal is a pulse signal that has a predetermined period.

In general, the threshold voltage of transistors in a semiconductor memory apparatus increases at low temperatures and decreases at high temperatures. In addition to the transistors, the operating characteristics of various other elements in a semiconductor integrated circuit are distorted according to a temperature change. Therefore, it is possible to prevent a reduction in operating efficiency when the semiconductor memory apparatus can adjust to temperature changes. Also, the refresh operation needs to be performed according to temperature changes. Therefore, a circuit that sets the period of a refresh signal according to a temperature condition is used.

Figure 1:
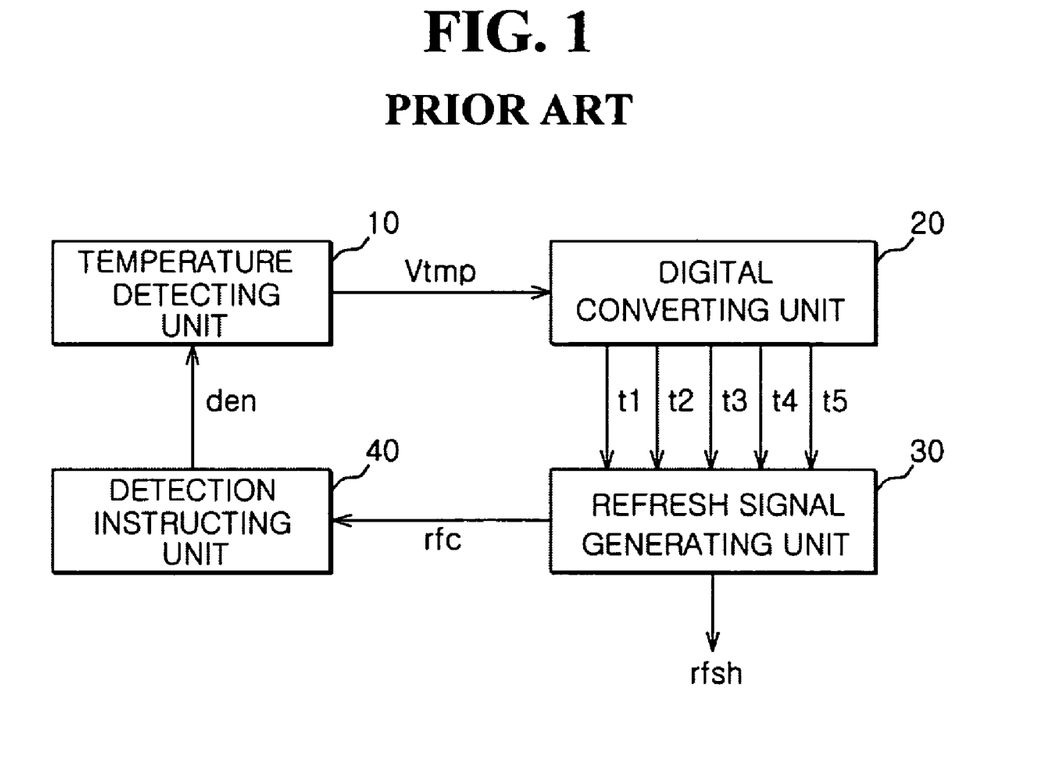
FIG. 1 shows the structure of a refresh control circuit for a semiconductor memory apparatus according to the prior art.

FIG. 1 shows the structure of a refresh control circuit for a semiconductor memory apparatus according to the related art. In FIG. 1, digital codes that are used to control the refresh period by detecting temperature have 5 bits.

As shown in FIG. 1, the refresh control circuit includes a temperature detecting unit 10 that detects the temperature according to whether a detection enable signal den is enabled or not, and generates a temperature detecting voltage Vtmp, a digital converting unit 20 that converts the temperature detecting voltage Vtmp into five bits of digital code t1 to t5, a refresh signal generating unit 30 that generates a refresh signal rfsh that has a period corresponding to the input of the five bits of digital code t1 to t5, and a reference signal rfc, and a detection instructing unit 40 that generates the detection enable signal den according to the input of the reference signal rfc.

The reference signal rfc generated by the refresh signal generating unit 30 is a signal that is enabled for every predetermined period to operate the detection instructing unit 40 regardless of the logic values of the inputted five bits of digital code t1 to t5. The detection instructing unit 40 generates the detection enable signal den according to the input of the reference signal rfc. Here, the detection enable signal den is generated such that it also has a predetermined period. Therefore, the temperature detecting unit 10 detects the temperature every predetermined period.

The temperature detecting voltage Vtmp output from the temperature detecting unit 10 is a voltage whose potential level changes according to a change in temperature. The digital converting unit 20 generates the five bits of digital code t1 to t5 that correspond to the level of the temperature detecting voltage Vtmp. The refresh signal generating unit 30 generates the refresh signal rfsh with a period corresponding to the logic values of the five bits of digital code t1 to t5.

Figure 2:
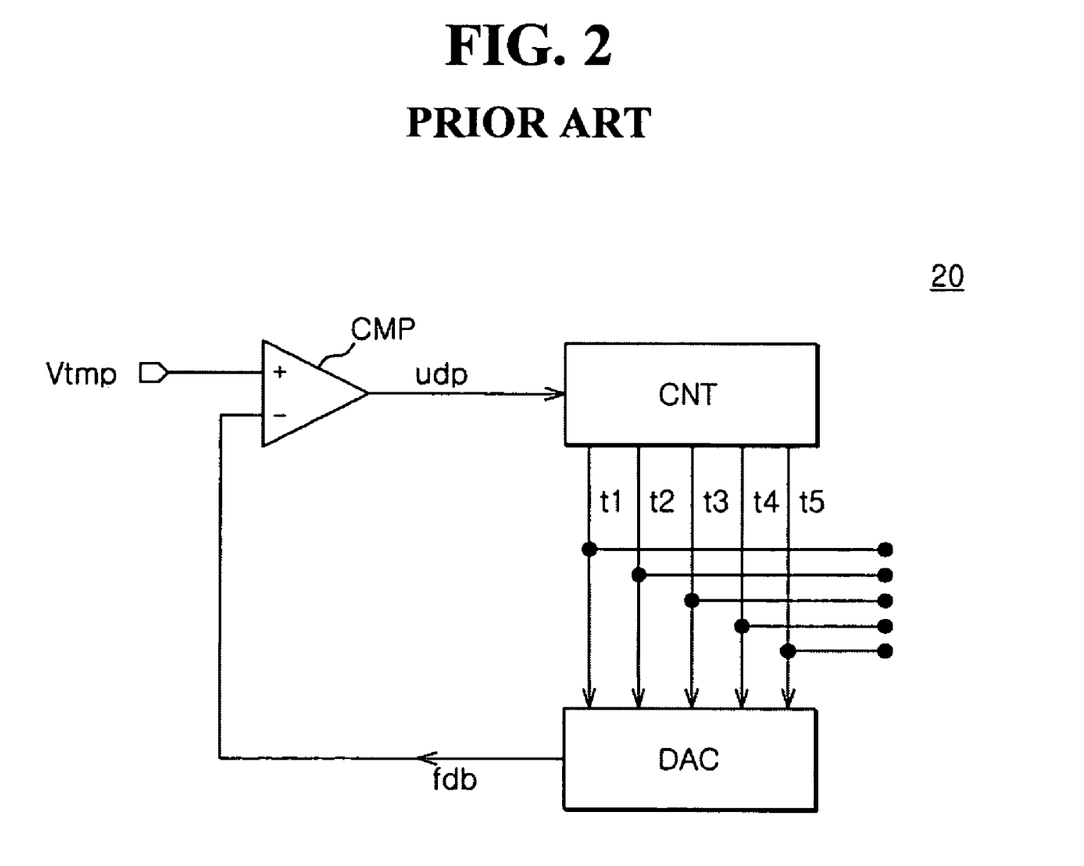
FIG. 2 shows the detailed structure of the digital converting unit shown in FIG. 1.

FIG. 2 shows the detailed structure of the digital converting unit shown in FIG. 1.

The digital converting unit 20 includes a comparator CMP that compares the temperature detecting voltage Vtmp with a feedback signal fdb and outputs an up/down indication signal udp, a counter CNT that generates the five bits of digital code t1 to t5 according to the up/down indication signal udp and transmits the five bits of digital code t1 to t5 to the refresh signal generating unit 30 and a DA converter DAC, and the DA converter DAC that converts the five bits of digital code t1 to t5 into the analog feedback signal fdb.

The up/down indication signal upd that is output from the comparator CMP has a potential of either a high level or a low level according to whether or not the potential level of the temperature detecting voltage Vtmp exceeds the potential level of the feedback signal fdb. Then, the counter CNT increases or decreases the logic values of the five bits of digital code t1 to t5 according to the potential level of the up/down indication signal udp. The five bits of digital code t1 to t5 that have arbitrary logic values according to such an operation are then transmitted to the refresh signal generating unit 30 so as to determine the period of the refresh signal rfsh. The DA converter DAC converts the five bits of digital code t1 to t5 into an analog signal again. The feedback signal fdb generated at this time is transmitted to the comparator CMP and compared with the temperature detecting voltage Vtmp.

However the digital converting unit 20 has a feedback structure. Therefore, when an error, such as a gain error or the like, occurs in a component such as the comparator CMP or the DA converter DAC, the error may be increasingly amplified through the feedback structure. Due to the small size of the various devices used in the semiconductor memory apparatus, high precision is required in manufacturing processes, which may also cause defects. In addition, each of the devices may malfunction because of a side effect, such as noise, caused by the high integration. For the above-described reasons, an error may occur in the comparator CMP and the DA converter DAC. As a result, the feedback structure of the digital converting unit 20 malfunctions, which increases the number of errors. The malfunction of the digital converting unit 20 affects the overall refresh control operation of the semiconductor memory apparatus. However, in the prior art, an apparatus and a method that can easily prevent the malfunction do not exist.

SUMMARY OF THE INVENTION

Embodiments of the present invention provide a refresh control circuit and method in a semiconductor memory apparatus that can stably control the period of a refresh signal according to temperature by preventing a malfunction due to errors occurring in components.

A first embodiment of the present invention provides a refresh control circuit that includes a temperature detecting unit configured to detect temperature and generate a temperature detecting voltage based on the detected temperature; a control unit configured to generate a plurality of control signals; a digital converting unit configured to convert the temperature detecting voltage into a plurality of bits of digital code and output the bits of digital code based on the control signals; and a refresh signal generating unit configured to generate a refresh signal with a period corresponding to the bits of digital code.

A second embodiment of the present invention provides a refresh control circuit for a semiconductor memory apparatus that includes a digital converting unit configured to generate a plurality of comparison voltages according to a plurality of control signals after dividing a reference voltage, and to generate a plurality of bits of digital code by comparing each of the comparison voltages with a temperature detecting voltage; and a refresh signal generating unit configured to generate a refresh signal with a period corresponding to the bits of digital code.

A third embodiment of the present invention provides a method of controlling the refresh period of a semiconductor memory apparatus that includes detecting temperature according to input of a detection enable signal so as to generate a temperature detecting voltage; converting the temperature detecting voltage into a plurality of the bits of digital code by controlling a plurality of control signals; generating a refresh signal with a period corresponding to the bits of digital code and a reference signal; and generating the detection enable signal according to the reference signal.

A fourth embodiment of the present invention provides a method of controlling the refresh period of a semiconductor memory apparatus that includes generating a plurality of comparison voltages by controlling a plurality of control signals after dividing a reference voltage, and generating a plurality of bits of digital code by comparing each of the comparison voltages with a temperature detecting voltage; and generating a refresh signal that has a period corresponding to the bits of digital code.

DESCRIPTION OF EXEMPLARY EMBODIMENT

Embodiments of the present invention will now be described in detail with reference to the accompanying drawings.

Figure 3:
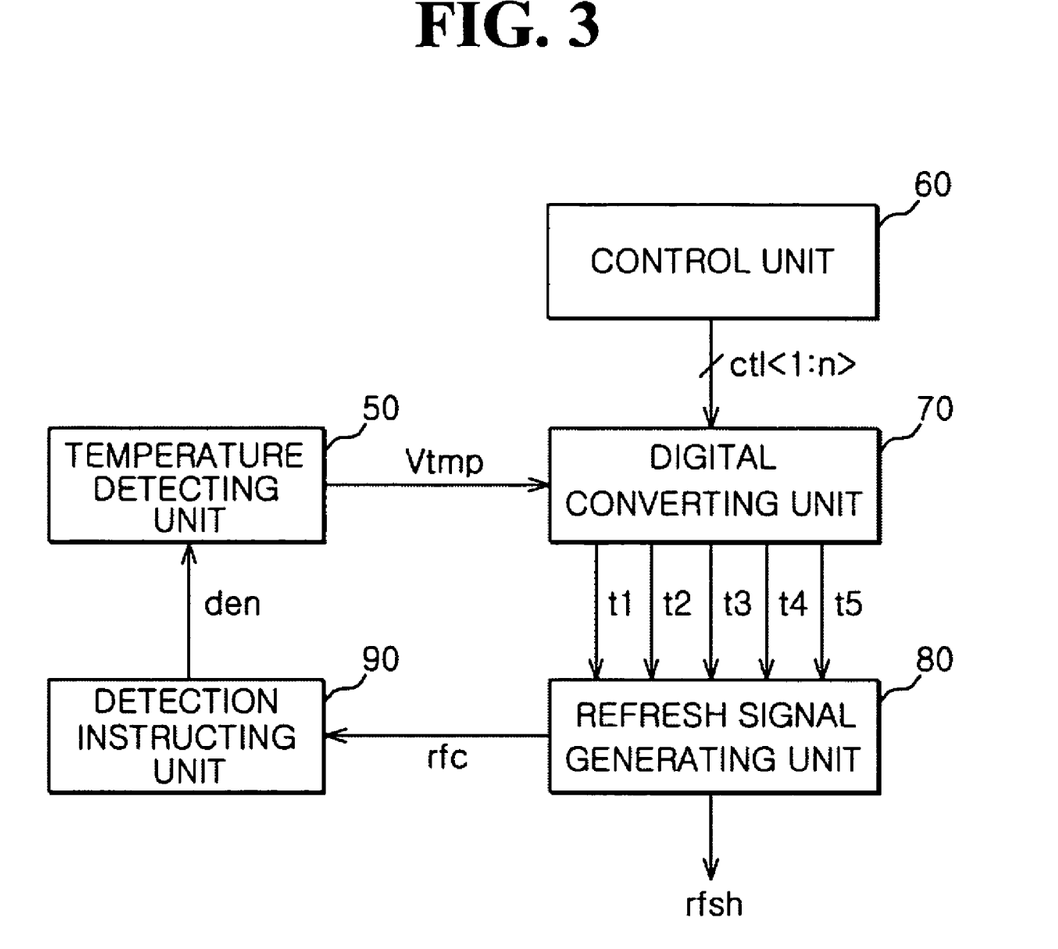
FIG. 3 shows the structure of a semiconductor memory apparatus according to an embodiment of the present invention.

Referring to FIG. 3, the refresh control circuit includes a temperature detecting unit 50 that detects the temperature according to whether a detection enable signal den is enabled or not and generates a temperature detecting voltage Vtmp based on the detecting temperature, a control unit 60 that generates "n" control signals ctl<1:n>, a digital converting unit 70 that converts the temperature detecting voltage Vtmp into five bits of digital code t1 to t5 and outputs the five bits of digital code t1 to t5 according to the control of "n" control signals ctl<1:n>, a refresh signal generating unit 80 that generates a refresh signal rfsh having a period corresponding to the five bits of digital code t1 to t5 and a reference signal rfc, and a detection instructing unit 90 that generates the detection enable signal den according to the input of the reference signal rfc.

The control unit 60 has the structure of a fuse circuit provided to artificially generate the "n" control signals ctl<1:n> or the structure of a circuit that decodes signals output from the fuse circuit to generate the "n" control signals ctl<1:n>. The "n" control signals ctl<1:n> are generated so as to finely adjust the operation of the digital converting unit 70, such that malfunctions due to errors caused by elements provided in the refresh control circuit can be prevented. Here, a method of generating the control signals ctl<1:n> is not limited to a specific method.

The reference signal rfc generated by the refresh signal generating unit 80 is a signal that is enabled every predetermined period so as to operate the detection instructing unit 90 regardless of the logic values of the input bits of digital codes t1 to t5. The detection instructing unit 90 generates the detection enable signal den according to the reference signal rfc. The detection enable signal den is generated with a predetermined period. Therefore, the temperature detecting unit 50 detects the temperature every predetermined period.

The temperature detecting voltage Vtmp that is output from the temperature detecting unit 50 is a voltage whose potential level varies according to a change in temperature. The digital converting unit 70 generates five bits of digital code t1 to t5 corresponding to the level of the temperature detecting voltage Vtmp according to the control of the "n" control signals ctl<1:n>. The refresh signal generating unit 80 generates the refresh signal rfsh with a period corresponding to the logic values of a plurality of bits of digital code t1 to t5.

Figure 4:
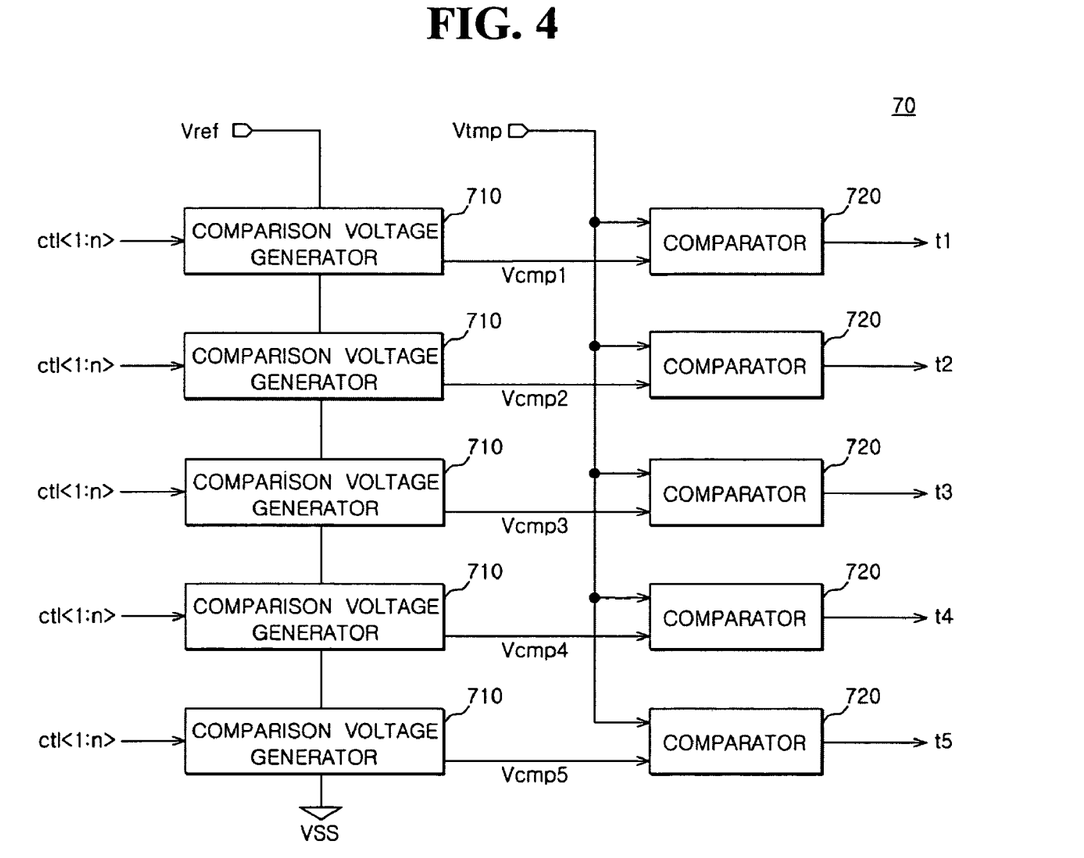
FIG. 4 shows the detailed structure of the digital converting unit shown in FIG. 3.

FIG. 4 shows the detailed structure of the digital-converting unit shown in FIG. 3.

The digital converting unit 70 includes five comparison voltage generators 710 connected in series that respectively generates five comparison voltages Vcmp<1:5> corresponding to the input of the "n" control signals ctl<1:n>, and five comparators 720 that respectively compare the five comparison voltages Vcmp<1:5>, which are respectively output from the five comparison voltage generators 710, with the temperature detecting voltage Vtmp, so as to output the comparison results as level signals.

The five comparison voltage generators 710 are configured in such a manner that the reference voltage Vref is applied to the first comparison voltage generator 710 and the final comparison voltage generator 710 is connected to a ground terminal.

The potential levels of the five comparison voltages Vcmp<1:5> that are respectively output from the five comparison voltage generators 710 are controlled by the "n" control signals ctl<1:n>. As such, each of the five comparison voltages Vcmp<1:5>, which are respectively output from the five comparison voltage generators 710, are compared with the temperature detecting voltage Vtmp by each of the five comparators 720. Then, the five comparators 720 output the comparison results as the respective level signals. Here, a combination of the five level signals is transmitted as the five bits of digital code t1 to t5 to the refresh signal generating unit 80, to generate the refresh signal rfsh.

When the potential level of the temperature detecting voltage Vtmp is changed by changing the temperature detected by the temperature detecting unit 50, the five comparators 720 output the combination of the five bits of digital code t1 to t5 according to the change in temperature. Therefore, the period of the refresh signal rfsh is controlled.

When the five comparators 720 in the digital converting unit 70 generate errors for some reason, the combination of the five bits of digital codes t1 to t5 is different from the set combination. In order to correct this, the "n" control signals ctl<1:n>, may be modified such that the potential levels of the five comparison voltages Vcmp<1:5> are controlled. As a result, a desired combination of the five bits of digital code t1 to t5 can be obtained.

Figure 5:
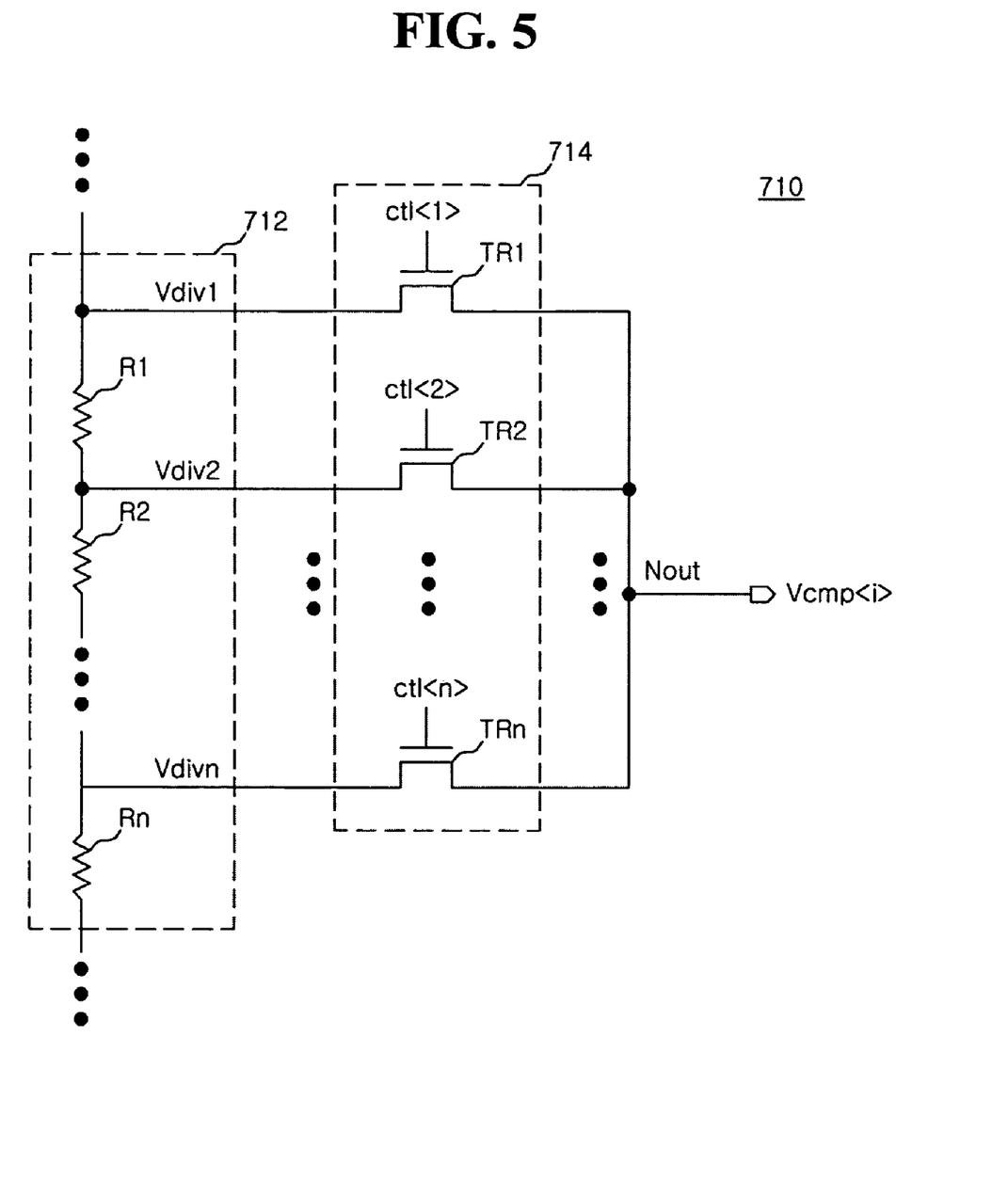
FIG. 5 shows the detailed structure of the comparison voltage generating unit shown in FIG. 4.

FIG. 5 shows the detailed structure of the comparison voltage generator shown in FIG. 4. In FIG. 5, one of the five comparison voltage generators is shown. Since all of the five comparison voltage generators have the same structure, a description of only one of the comparison voltage generators will be made.

The comparison voltage generating unit 710 includes a dividing part 712 and a switching part 714. A dividing part 712 is connected between the preceding comparison voltage generator 710 and the subsequent comparison voltage generator 710. But, first dividing part 712 is connected between an input terminal of the reference voltage Vref and the subsequent comparison voltage generator 710. Further, the last dividing part 712 is connected between preceding comparison voltage generator 710 and the ground terminal. Further the dividing part 712 outputs "n" divided voltages Vdiv<1:n>. The switching part 714 that extracts one Vdiv<j> of the "n" divided voltages Vdiv<1:n> according to the input of the "n" control signals ctl<1:n>, and outputs it as the comparison voltage Vcmp<i>.

The dividing part 712 includes "n" resistors R<1:n> that are connected in series. Therefore, the voltages that are respectively applied to the "n" resistors R<1:n> become the "n" divided voltages Vdiv<1:n>. That is, since five dividing parts 712 are provided in the digital converting unit 70, the total number of resistors is 5n. Therefore, the five dividing parts 712 have a resistor array in which "5n" resistors are connected in series. As a result, the 5n divided voltages Vdiv<1:n> are generated by the reference voltage Vref that is applied to the resistor array.

Further, the switching part 714 includes "n" transistors TR<1:n>. The transistors TR<1:n> have gate terminals to which "n" control signals ctl<1:n> are respectively input, drain terminals to which "n" divided voltages Vdiv<1:n> are respectively applied, and source terminals connected to an output node Nout.

When any one of the "n" control signals ctl<1:n> has a potential at a high level, the transistor TR<j> receiving the control signal having the high level, is turned on and transmits the divided voltage Vdiv<j> to the drain terminal as the comparison voltage Vcmp<i> to the output node Nout. The remaining transistors receiving the control signals having a low level are turned off and cannot transmit the corresponding divided voltage Vdiv<j> to the output node Nout.

That is, the dividing parts 712 that are respectively provided in the five comparison voltage generators 710 divide the reference voltage Vref and generate the "n" divided voltages Vdiv<1:n>. Each of the switching parts 714 extracts one divided voltage Vdiv<j> among the "n" divided voltages Vdiv<1:n> according to the input of the "n" control signals ctl<1:n>, and outputs the divided voltage Vdiv<j> as the comparison voltage Vcmp<i>.

According to the embodiments of the present invention, the digital converting unit 70 can cope with errors of components, such as the comparator, etc., more efficiently. That is, since the digital converting unit 70 does not have the feedback structure according to the prior art, the possibility of the error circulating and amplifying due to the feedback structure is prevented. In addition, in consideration of component errors, the "n" comparison voltages Vcmp<1:n> can be generated by using the "n" control signals ctl<1:n>. Then, the "n" comparison voltages Vcmp<1:n> are compared with the temperature detecting voltage Vtmp to generate the five bits of digital code t1 to t5. Therefore, malfunctions caused by the component errors can be reduced. As such, the refresh control operation can be controlled by using the "n" control signals ctl<1:n>, and the malfunction of the semiconductor component that is caused by errors can be prevented.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

The refresh control circuit and the method of controlling the same in the semiconductor memory apparatus according to embodiments of the present invention can more stably control the period of a refresh signal according to temperature by preventing malfunctions due to the component errors.

What is claimed is:

1. A refresh control circuit for a semiconductor memory apparatus, comprising:
    a temperature detecting unit configured to detect temperature and generate a temperature detecting voltage based on the detected temperature;
    a control unit configured to generate a plurality of control signals;
    a digital converting unit configured to receive the plurality control signals, to convert the temperature detecting voltage into a plurality of bits of digital code and output the bits of digital code based on the plurality of control signals; and
    a refresh signal generating unit configured to generate a refresh signal with a period corresponding to the bits of digital code.

2. The refresh control circuit of claim 1,
    wherein the digital converting unit is configured to divide a reference voltage and generate a plurality of comparison voltages according to the control signals, and generate the bits of digital code by comparing each of the comparison voltages with the temperature detecting voltage.

3. The refresh control circuit of claim 2,
    wherein the digital converting unit includes:
    a plurality of comparison voltage generators connected in series configured to divide the reference voltage to generate the comparison voltages according to the control signals; and
    a plurality of comparators configured to compare the comparison voltages with the temperature detecting voltage and to output level signals, which are generated according to the comparison, as one bit of the digital code.

4. The refresh control circuit of claim 3,
    wherein each of the comparison voltage generators includes:
    a dividing part connected to a preceding comparison voltage generator or a reference voltage input terminal, and a subsequent comparison voltage generator or a ground terminal, configured to output a plurality of divided voltages; and
    a switching part configured to extract one of the divided voltages according to input of the control signals, and output the extracted divided voltage as the comparison voltage.

5. The refresh control circuit of claim 4,
wherein the dividing part includes a plurality of resistors connected in series.

6. The refresh control circuit of claim 4,
wherein the switching part includes a plurality of transistors having gate terminals to which a plurality of control signals are respectively input, drain terminals to which a plurality of divided voltages are respectively applied, and source terminals connected to an output node, and wherein
the comparison voltage is generated at the output node.

7. The refresh control circuit of claim 1,
wherein the temperature detecting voltage is a voltage whose potential level changes according to a change in temperature.

8. The refresh control circuit of claim 1,
wherein the control signals are generated according to whether a plurality of fuses provided in a fuse circuit are connected or not.

9. The refresh control circuit of claim 1,
wherein the control signals are generated by decoding signals that are generated in a fuse circuit.

10. The refresh control circuit of claim 1, further comprising:
a detection instructing unit configured to generate a detection enable signal that instructs operation of the temperature detecting unit according to input of the reference signal that is generated by the refresh signal generating unit.

11. A refresh control circuit for a semiconductor memory apparatus, comprising:
a digital converting unit configured to generate a plurality of comparison voltages according to a plurality of control signals after dividing a reference voltage, and to generate a plurality of bits of digital code by comparing each of the comparison voltages with a temperature detecting voltage; and
a refresh signal generating unit configured to generate a refresh signal with a period corresponding to the bits of digital code.

12. The refresh control circuit of claim 11,
wherein the digital converting unit includes:
a plurality of comparison voltage generators connected in series configured to divide the reference voltage to generate the comparison voltages according to the control signals; and
a plurality of comparators configured to compare the comparison voltages with the temperature detecting voltage and to output level signals, which are generated according to the comparison results, as one bit of the digital code.

13. The refresh control circuit of claim 12,
wherein each of the comparison voltage generators includes:
a dividing part connected to a preceding comparison voltage generator or a reference voltage input terminal, and a subsequent comparison voltage generator or a ground terminal, and configured to output a plurality of divided voltages; and
a switching part configured to extract one of the divided voltages according to the control signals and output the extracted divided voltage as the comparison voltage.

14. The refresh control circuit of claim 13,
wherein the dividing part includes a plurality of resistors connected in series.

15. The refresh control circuit of claim 13,
wherein the switching part includes a plurality of transistors having gate terminals to which a plurality of control signals are respectively input, drain terminals to which a plurality of divided voltages are respectively applied, and source terminals connected to an output node; and wherein
the comparison voltage is generated at the output node.

16. The refresh control circuit of claim 11,
wherein the temperature detecting voltage is a voltage whose potential level changes according to a change in temperature.

17. The refresh control circuit of claim 11,
wherein the control signals are generated according to whether a plurality of fuses provided in a fuse circuit are connected or not.

18. The refresh control circuit of claim 11,
wherein the control signals are generated by decoding signals that are generated by a fuse circuit.

19. The refresh control circuit of claim 11, further comprising:
a detection instructing unit configured to generate a detection enable signal according to the reference signal that is generated by the refresh signal generating unit.

20. The refresh control circuit of claim 11, further comprising:
a temperature detecting unit configured to generate the temperature detecting voltage according to whether the detection enable signal is enabled or not.

21. A method of controlling a period of a refresh signal in a semiconductor memory apparatus, comprising:
detecting temperature according to input of a detection enable signal so as to generate a temperature detecting voltage;
receiving a plurality of control signals;
converting the temperature detecting voltage into a plurality of bits of digital code by controlling the plurality of control signals;
generating a refresh signal with a period corresponding to the bits of digital code and a reference signal; and
generating the detection enable signal according to the reference signal.

22. The method of claim 21,
wherein the converting of the temperature detecting voltage into a plurality of bits of digital code includes:
generating a plurality of comparison voltages according to control of the control signals by dividing a reference voltage, and
generating the bits of digital code by comparing each of the comparison voltages with the temperature detecting voltage.

23. The method of claim 22,
wherein the converting of the temperature detecting voltage into the bits of digital code includes:
dividing the reference voltage to generate the comparison voltages according to the control signals; and
comparing the comparison voltages with the temperature detecting voltage and outputting a plurality of level signals, which are generated according to the comparison results, as the bits of digital code.

24. The method of claim 23,
wherein the dividing of the reference voltage to generate the comparison voltages according to the control signals includes:
dividing the reference voltage to generate a plurality of divided voltages; and extracting one of the divided voltages according to the input of a plurality of control signals and outputting the extracted divided voltage as the comparison voltage.

25. The method of claim 21,
wherein the temperature detecting voltage is a voltage whose potential level changes according to a change in temperature.

26. The method of claim 21,
wherein the control signals are generated according to whether a plurality of fuses provided in a fuse circuit are connected or not.

27. The method of claim 21,
wherein the control signals are generated by decoding signals that are generated by a fuse circuit.

28. A method of controlling a period of a refresh signal in a semiconductor memory apparatus, comprising:
generating a plurality of comparison voltages by controlling a plurality of control signals after dividing a reference voltage, and generating a plurality of bits of digital code by comparing each of the comparison voltages with a temperature detecting voltage; and
generating a refresh signal that has a period corresponding to the bits of digital code.

29. The method of claim 28,
wherein the generating of the comparison voltages by controlling the control signals after dividing the reference voltage and generating the bits of digital code by comparing each of the comparison voltages with the temperature detecting voltage includes:
dividing the reference voltage to generate the comparison voltages according to the control signals; and
comparing each of a plurality of comparison voltages with the temperature detecting voltage and outputting a plurality of level signals, which are generated according to the comparison results, as the bits of digital code.

30. The method of claim 29,
wherein the dividing of the reference voltage to generate the comparison voltages according to the control signals includes:
dividing the reference voltage to generate a plurality of divided voltages; and
extracting one of the divided voltages and outputting the divided voltage as the comparison voltage according to the control signals.

31. The method of claim 28,
wherein the temperature detecting voltage is a voltage whose potential level changes according to a change in temperature.

32. The method of claim 28,
wherein the control signals are generated according to whether a plurality of fuses provided in a fuse circuit are connected or not.

33. The method of claim 28,
wherein the control signals are generated by decoding signals that are generated by a fuse circuit.

34. The method of claim 28, further comprising:
generating a detection enable signal according to the input of a reference signal is generated in the generating of the refresh signal with a period corresponding to the input the bits of digital code.

35. The method of claim 34, further comprising:
detecting the temperature according to the input of the detection enable signal and generating the temperature detecting voltage.

* * * * *